United States Patent [19]

Hatta

[11] Patent Number: 5,499,215
[45] Date of Patent: Mar. 12, 1996

[54] SEMICONDUCTOR MEMORY

[75] Inventor: Minoru Hatta, Osaka, Japan

[73] Assignee: Matsushita Electronics Corporation, Osaka, Japan

[21] Appl. No.: 321,964

[22] Filed: Oct. 11, 1994

[30]    Foreign Application Priority Data

Nov. 1, 1993    [JP]    Japan .................................... 5-273420

[51] Int. Cl.$^6$ ...................................................... G11C 8/00
[52] U.S. Cl. ............................... 365/230.03; 365/230.09; 365/206; 365/149; 365/189.12; 365/63
[58] Field of Search ................................. 365/230.03, 63, 365/230.09, 189.05, 189.08, 189.12, 149, 206

[56]                References Cited

U.S. PATENT DOCUMENTS

| | | | |
|---|---|---|---|
| 5,323,349 | 6/1994 | Hamade et al. | 365/149 |
| 5,327,389 | 6/1994 | Seok et al. | 365/230.03 |
| 5,369,619 | 11/1994 | Ohba | 365/230.03 |
| 5,386,387 | 1/1995 | Tanizaki | 365/230.03 |

FOREIGN PATENT DOCUMENTS 1-241093    9/1989    Japan .

OTHER PUBLICATIONS

T. Sugibayashi et al., "Non-volatile, Dynamic, and Experimental Memories", IEEE International Solid-State Circuits Conference, pp. 50–51, Feb. 1993.

Primary Examiner—David C. Nelms
Assistant Examiner—Huan Hoang
Attorney, Agent, or Firm—Willian Brinks Hofer Gilson & Lione

[57]                ABSTRACT

Sub data buses extending in the bit-line direction and sense amplifiers are connected to each other by inside-cell-array-block inside-column-block column select lines which are controlled by (i) column-block select lines extending in the bit-line direction and (ii) inside-cell-array-block column select lines which cross at right angles thereto. The number of the sub data bus pairs is equal to the number of columns which are simultaneously selected by all inside-cell-array-block column select line. According to the present invention, the number of the sub data bus pairs is increased as compared with a conventional DRAM. However, the sub data bus pairs to be connected to the sense amplifiers are limited only to those in a column block selected out of a plurality of column blocks into which cell array blocks are divided. This prevents the power consumption from being increased. Further, column switch transistors connected to each sub data bus are reduced in number to lower the parasitic capacitance, thus enabling a high density DRAM to be operated at a high speed.

11 Claims, 13 Drawing Sheets

SEMICONDUCTOR MEMORY

BACKGROUND OF THE INVENTION

The present invention relates to improvements in a mass semiconductor memory having a plurality of cell array blocks, and more particularly to improvements in a mass semiconductor dynamic random access memory (DRAM).

Recently, the DRAMs are remarkably improved in components per chip to such an extent that there are mass-produced DRAMs in which one chip has a 16M-bit memory capacity. In such a high density DRAM, it is required that the voltage read out from a memory cell is maintained at a value not less than a predetermined value, that wiring delay is restrained and that the areas to be simultaneously operated are reduced in number to lower the power consumption. Accordingly, the number of memory cells connected to one bit line or one word line cannot excessively be increased. In this connection, there is used an arrangement in which the cell array on one chip is divided into a plurality of cell array blocks.

A conventional high density DRAM of the type above-mentioned is usually arranged such that one column decoder is disposed for a plurality of cell array blocks, and that column select lines connected to the output terminals of the column decoder are disposed in parallel with bit lines over the cell arrays and extend over the cell array blocks such that each column-select line is shared by the cell array blocks. Further, sub data buses are disposed respectively for each cell array block at right angles to the column select lines, and the column select lines control the connection of the sub data buses to sense amplifiers in the cell array blocks. Generally, the column select lines are formed of the second layer of aluminium and extend in parallel with the bit lines on the cell arrays. Generally, the word lines are formed of the first layer of aluminium. Accordingly, the column select lines are disposed on the word lines. The following description will discuss a conventional DRAM of the type above-mentioned with reference to FIGS. 10, 11, 12.

FIG. 12 is a schematic view illustrating the block diagram of a chip in its entirety. A 16-MDRAM having an arrangement of 1M×16 bits is shown by way of example. Each of cell arrays is largely divided into four portions which correspond to data input/output terminals I/O0~3, I/O4~7, I/O8~11, I/O12~15. FIG. 11 shows in detail a half of the portions of the cell array corresponding to the I/O0~3. Disposed in these portions are memory cells, sense amplifiers and the like corresponding to the I/O0 and I/O1. In FIG. 11, the word lines extend longitudinally while the bit lines extend transversely. A cell array portion for one I/O is further divided into four cell array blocks. Disposed in the cell array blocks are memory cells arranged in rows and columns, sense amplifiers for these memory cells and so on.

In a small-capacity DRAM, column decoders are also disposed on the areas on which sense amplifiers in the cell array blocks are disposed. In a high density DRAM, however, it is common to adopt such an arrangement as shown in FIG. 12 in order to save chip area, disposing column decoders at an end of each of said four largely divided portions instead of in each cell array block and disposing column select lines, which are connected to the column decoder outputs, over the bit lines in parallel therewith, i.e., horizontally in FIG. 12, in second-level aluminum or the like so that each column select line is shared by the cell array blocks.

FIG. 10 shows in detail the inside of a cell array block and the connections of cell array blocks to each other. This arrangement adopts a shared sense amplifier scheme in which sense amplifiers SA0, SA1 . . . SA1022, SA1023 are disposed at the center of each cell array block. A bit-line connection selecting signal TG0 or TG1 causes the sense amplifiers SA0 . . . SA1023 to be selectively connected, through switch transistors 21, 22, 23, 24 . . . 141, 142, 143, 144 or 31, 32, 33, 34 . . . 151, 152, 153, 154, to bit line pairs BL0, /BL0, BL1, /BL1 . . . BL1022, /BL1022, BL1023, /BL1023 or BU0, /BU0, BU1, /BU1 . . . BU1022, /BU1022, BU1023, /BU1023. After the sense amplifiers start amplifying operations, column select lines CS0 . . . CS511 cause the sense amplifiers to be selectively connected, through column switch transistors 91, 92, 93, 94, to sub data buses D0A, /D0A, D0B, /D0B which extend in the word-line extending direction at the centers of the blocks.

For example, it is now supposed that a memory cell M0 is selected. In this case, the bit-line connection selecting signal TG0 becomes active, and the data read from the selected memory cell M0 to the bit line pair BL0, /BL0 by a word line WL0, is amplified by the sense amplifier SA0. Thereafter, the column select line CS0 becomes active and the sense amplifiers SA0 and SA1 are connected to the sub data buses D0A, /D0A and D0B, /D0B through the column switch transistors 91, 92 and 93, 94. Out of the sub data buses, the sub data buses D0A, /D0A connected to the memory cell M0 are selected by a block selecting switch BS0 and connected to I/O main data buses 7. Thereafter, the data is output from the data input/output terminal I/O0 through an output buffer 3 at the time of a read operation, and is entered from the data input/output terminal I/O0 through an input buffer 4 at the time of a write operation.

In such a conventional DRAM, the parasitic capacitance in the sub data buses becomes great, thus disadvantageously preventing the operation from being carried out at a high speed. For example, in the arrangement shown in FIG. 10 in which sub data buses in one cell array block are divided in two pairs, the number of the column switch transistors connected to one sub data bus, ends up reaching as many as 512. The drain junction capacitance and gate-drain capacitance of the column switch transistors form the parasitic capacitance of each sub data bus, thus increasing the sub data buses in parasitic capacitance. At the time of read operation, the sub data buses having large parasitic capacitance are required to be driven directly by the sense amplifiers. Accordingly, it takes much time to drive the sub data buses, thus disadvantageously preventing the operation to be conducted at a high speed. When the number of the sub data buses in one cell array block is increased, the number of the column switch transistors connected to one sub data bus is decreased to lower the sub data buses in parasitic capacitance. According to this method, however, the increase in the number of the sub data buses provokes an unallowable increase in chip area and an increase in power consumption. Thus, this method cannot serve as effective solving means.

In this connection, there is proposed a semiconductor memory disclosed by Japanese Laid-Open Patent Publication 1-241093. As shown in FIG. 13, this semiconductor memory is arranged in the following manner. In each of memory cell array blocks 200, 201 . . . , divided bit lines 220 . . . are respectively disposed for a large number of sense amplifiers 210 . . . and connected to a large number of common bit lines (sub data buses) 240 . . . through selection gate transistors 230 . . . . Before transferred to the common bit lines (sub data buses) 240, the output voltage of a selected memory cell array ( e.g., BL1, /BL1) is amplified by the sense amplifiers 210 on the divided bit lines 220. Then, the amplifying operation of the sense amplifiers 210 is stopped. By turning the selection gate transistors 230 . . . to ON, the divided bit lines 220 are connected to the common bit lines 240. Accordingly, the parasitic capacitance of the divided bit lines 220 . . . performs the function equivalent to that of the cell capacitance of a DRAM. With the selection gate transistors 230 . . . regarded as the transfer gates of DRAM cells, the electric charge is redistributed to a voltage which corresponds to the ratio in capacity between the divided bit lines 220 and the common bit lines 240. This compresses the voltage amplitude of the common bit lines (sub data buses), thus reducing the semiconductor memory in power consumption.

In the arrangement above-mentioned, however, after the sense amplifiers 210 . . . have fully amplified the voltage amplitudes of the divided bit lines 220 . . . , the voltages of the divided bit lines 220 . . . are transferred to the common bit lines. Accordingly, the read operation slows down and the timing control becomes complicated.

A conventional DRAM of the type above-mentioned presents the problem that it is difficult to develop it into a semiconductor memory with special functions being added, such as a video RAM. More specifically, in a video RAM, it is required to transfer the whole or a portion of data for one word line to a serial input/output register and to output the data serially at a high speed rate for a screen display. In a small-capacity DRAM comprising, in its entirety, one cell array block, the requirements above-mentioned are achieved by disposing one serial input/output register in all and by connecting the bit line pairs directly to the serial input/output register. However, in a high density DRAM comprising a large number of word lines, which are divided among a number of cell array blocks, it is required, in order to share one serial input/output register by the cell array blocks, that a large number of data transferring lines are disposed for connecting the sense amplifiers in the cell array blocks to the serial input/output register, the data transferring lines being in parallel with the bit lines. This means that, in the conventional arrangement, the data transferring lines run in parallel with a large number of column select lines. Such a wiring is difficult unless a wiring layer is added.

In this connection, the serial input/output register may be disposed, for example, for each of the cell array blocks. In such an arrangement, the bit line pairs may be connected directly to the serial input/output registers as conventionally done. This may solve the wiring problem, but disadvantageously increases the chip area to an unallowable extent owing to the increase in the number of the registers.

APPLICATION OF THE DISCLOSURE

It is an object of the present invention to provide a mass semiconductor memory simplified in arrangement capable of achieving, without an increase in power consumption and production cost, a high-speed operation because of reduction in the parasitic capacitance of sub data buses, and also to provide, with a low production cost, a high-density semiconductor memory for which special functions such as serial input and/or serial output functions are provided.

To achieve the object above-mentioned, the present invention is arranged such that each of a plurality of cell array blocks is conceptually divided into a plurality of column blocks in the word-line direction, and that sub data buses are connected to sense amplifiers in one column block in the cell array block to which a selected memory cell belongs.

The present invention provides a semiconductor memory having dynamic memory cells arranged in matrix and a plurality of cell array blocks comprising sense amplifiers for amplifying signals of the dynamic memory cells, and is characterized in that the semiconductor memory comprises: a plurality of column-block select lines shared by the plurality of cell array blocks and extending substantially in parallel with bit lines, a selected column-block select line being adapted to select a predetermined column block out of a plurality of column blocks which are formed by conceptually dividing the cell array blocks, which are adjacent to one another in the word-line direction, and each of which has a plurality of predetermined columns; a plurality of global column select lines (inside-cell-array-block column select lines) disposed in the cell array blocks and extending in the direction at right angles to the column-block select lines, a selected global column select line being adapted to simultaneously select a plurality of predetermined columns out of each of the plurality of column blocks; a plurality of sub data buses shared by the plurality of cell array blocks, the number of the sub data buses being set for each of the column blocks such that there can be simultaneously transferred as many data bits as those of columns, simultaneously selected by a global column select line, in a column block, the sub data buses being substantially in parallel with the column-block select lines; a plurality of local column selecting means (inside-cell-array-block inside-column-block column selecting means) respectively disposed at positions corresponding to the positions where the plurality of column-block select lines cross the plurality of global column select lines, the plurality of inside-column-local column selecting means being adapted such that the output of the local column selecting means located at the position where an activated column-block select line crosses an activated global column select line, is made active; and a plurality of local column select lines connected to the output terminals of the local column selecting means, each local column select line (inside-cell-array-block inside-column-block column select line) being connected to the input terminals of column switch transistors which connect sense amplifiers of columns, selected by an associated global column select line, in a cell array block comprising the local column select line, and in a column block selected by an associated column-block select line, to sub data buses in the selected column-block.

According to the arrangement above-mentioned, after sense amplifiers start operating, the column-block select line and the global column select line relating to a selected memory cell, are made active. This makes active the output of the local column selecting means located at the position where both select lines above-mentioned cross each other, thus making active the local column select line connected to the output terminal of the local column selecting means above-mentioned. Accordingly, there is selected one column block in the cell array block including the selected memory cell. In this one column block to which the selected memory cell belongs, the column switch means connected to the local column select line which has been made active, is operated to connect the sense amplifiers in the column selected by the global column select line, to a plurality of sub data buses. The data of the selected memory cell is written or read through the sub data bus relating to the selected memory cell, out of the plurality of sub data buses.

Likewise the column-block select lines, the sub data buses are disposed in parallel with the bit lines, and the number of the column-block select lines is considerably smaller than that of the column-block select lines in a conventional high density DRAM. Accordingly, a large number of sub data buses can be formed in the same wiring layer as the column-block select lines. Further, the sub data buses can overlap the bit lines and the word lines of the memory cell arrays likewise the column select lines in a conventional high density DRAM. Thus, the number of the wiring layers is not increased.

Although the number of the sub data bus pairs is equal to the number of the columns simultaneously selected by an inside-cell-array-block column select line, the sub data bus pairs to be connected to the sense amplifiers are limited only to those present in a selected column block. Accordingly, the power consumption for driving the sub data buses is small and the entire power consumption is not substantially increased.

Further, in case of developing a video RAM or the like according to the present invention, the sub data buses can be utilized for data transfer between memory cells in cell array blocks and serial input/output registers since there are a large number of sub data buses and each sub data bus is shared by the cell array blocks. Therefore, without a wiring for data transfer newly disposed, the serial input/output registers can be shared by the cell array blocks, thus lowering the production cost.

These and other features, objects and advantages of the present invention will be more fully apparent from the following detailed description set forth below when taken in conjunction with the accompanying drawings.

BRIEF DESCRIPTION OF THE DRAWINGS

The attached drawings show preferred embodiments of the present invention and conventional examples, wherein.

DETAILED DESCRIPTION OF THE INVENTION

The following description will discuss preferred embodiments of the present invention with reference to attached drawings.

(First Embodiment)

The following description will discuss a first embodiment of the present invention with reference to FIGS. 1, 2, 3, 4, 5.

Figure 4:
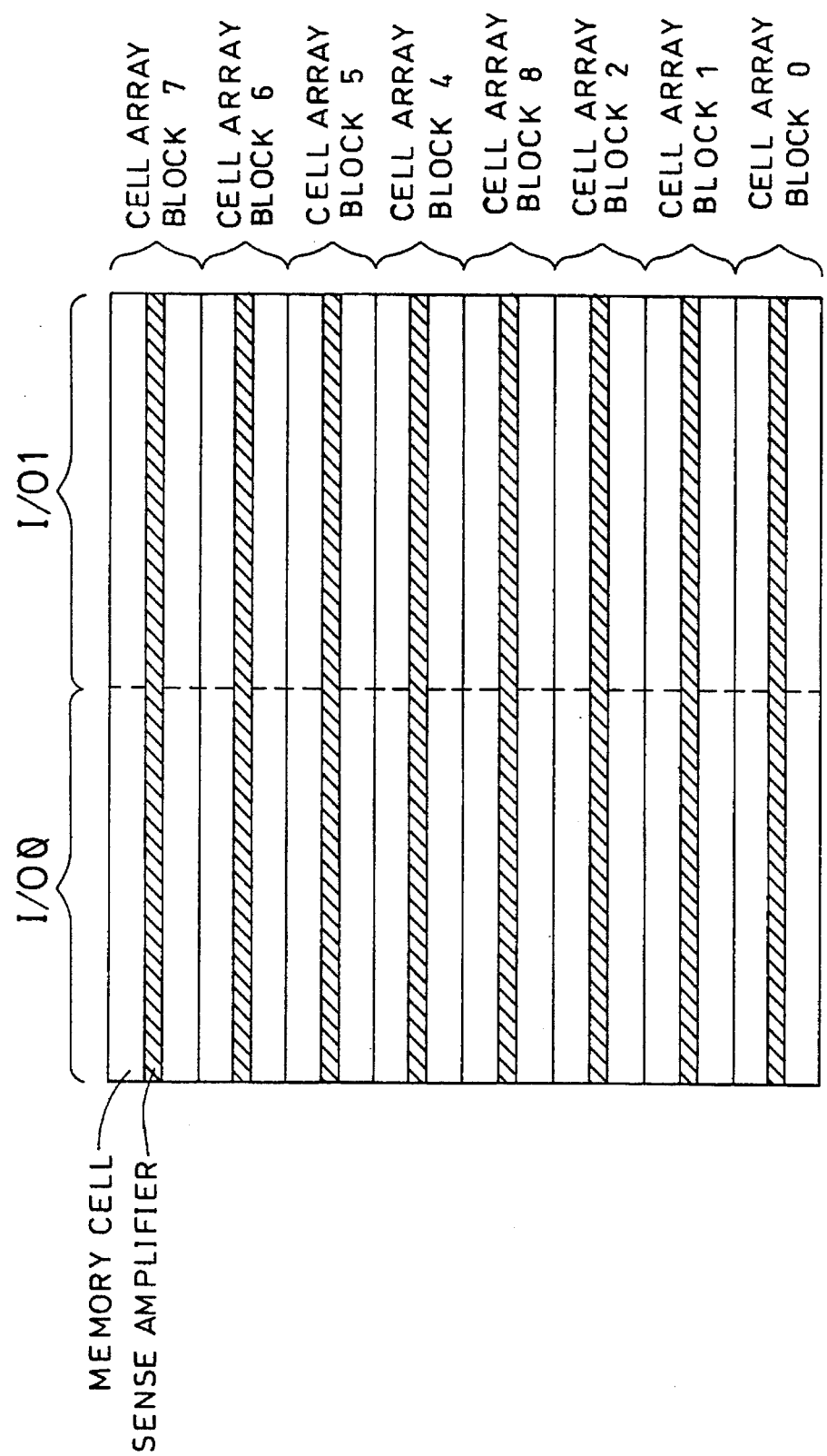
FIG. 4 shows a block diagram of cell arrays which are corresponding to ⅛ of the entire cell arrays of the DRAM in FIG. 1.
Figure 5:
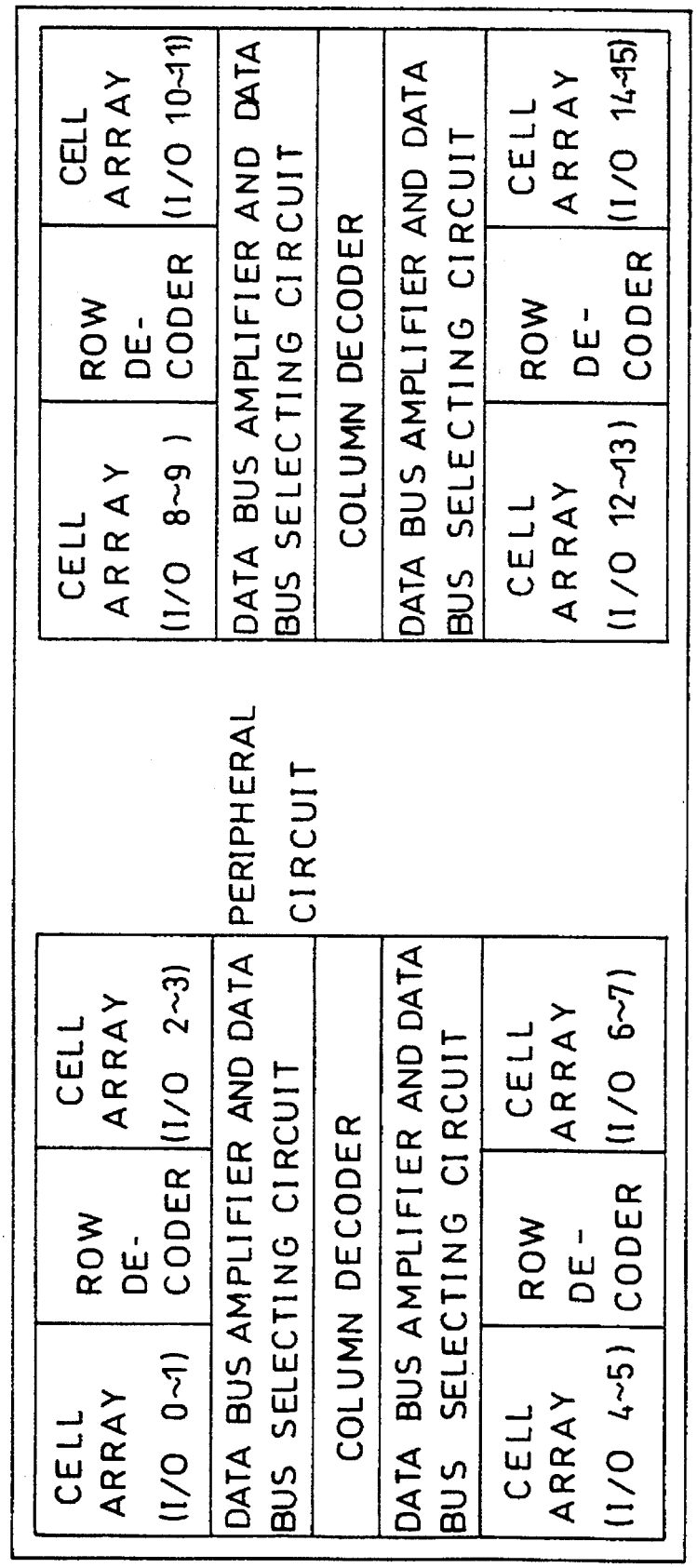
FIG. 5 shows a block diagram illustrating the entire arrangement of the chip of the DRAM in FIG. 1.
Figure 12:
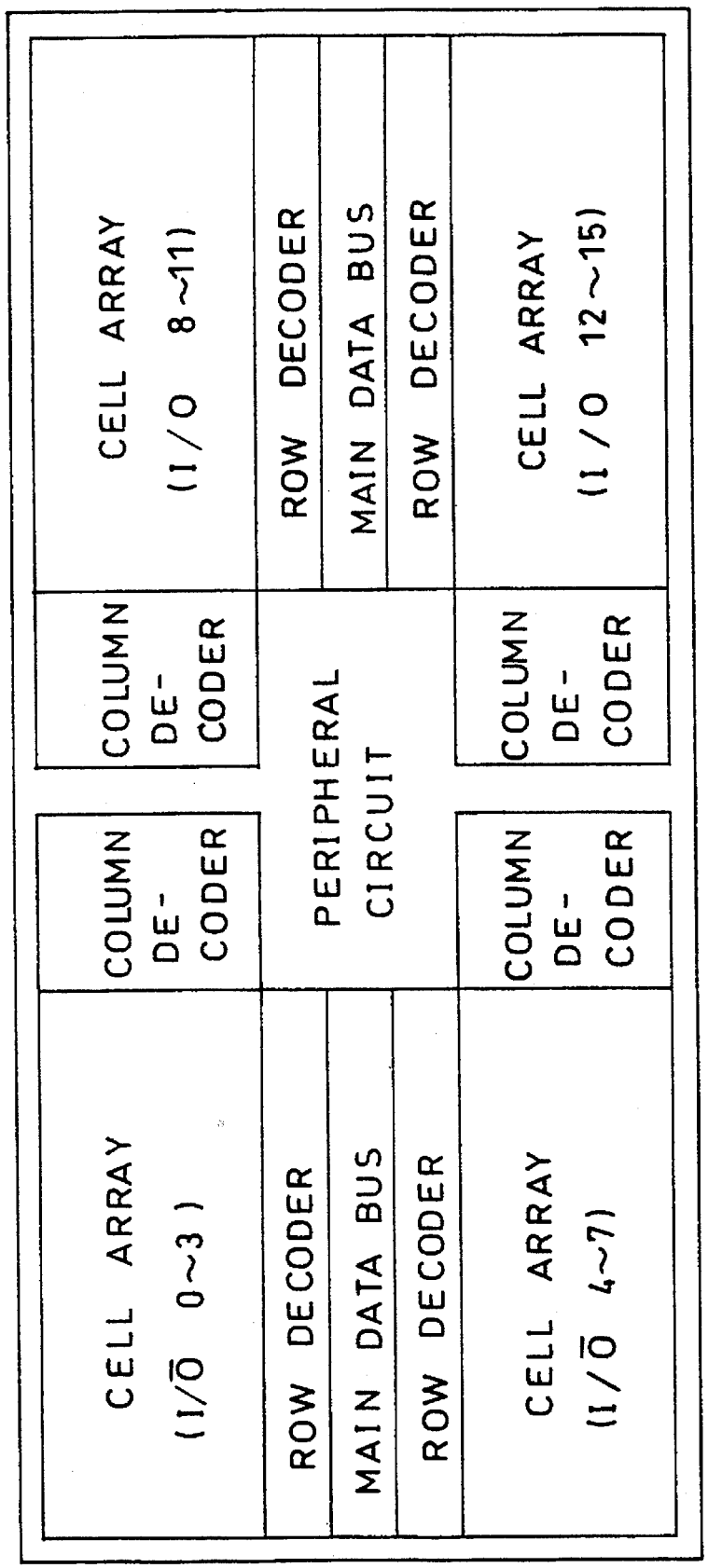
FIG. 12 is a block diagram illustrating the entire arrangement of the conventional semiconductor memory.
Figure 13:
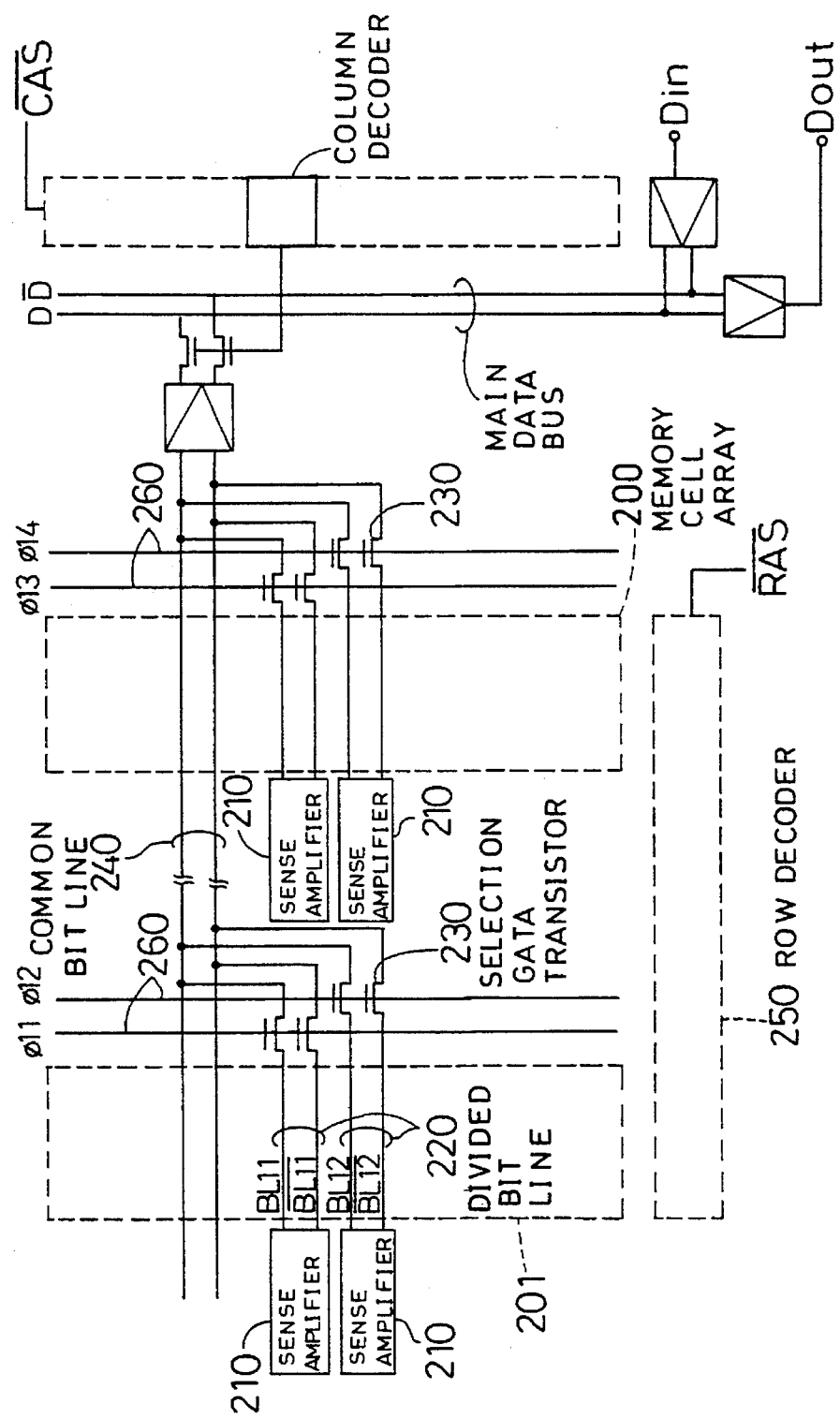
FIG. 13 is a block diagram of another conventional semiconductor memory.

FIG. 5 is an entire schematic block diagram of a DRAM chip in the form of a 16-MDRAM having an arrangement of 1M×16 bits likewise in a conventional example in FIG. 12. In FIG. 5, cell arrays are largely divided into eight portions which correspond to data input/output terminals I/O0~1, I/O2~3, I/O4~5, I/O6~7, I/O8~9, I/O10~11, I/O12~13, I/O14~15, respectively. FIG. 4 shows in detail the cell array portions corresponding to the data input/output terminals I/O0~1. In FIG. 4, there are eight cell array blocks of which left-side half portions correspond to I/O0 and of which right-side half portions correspond to I/O1. In FIG. 4, the word lines run transversely, while the bit lines run longitudinally.

Figure 1:
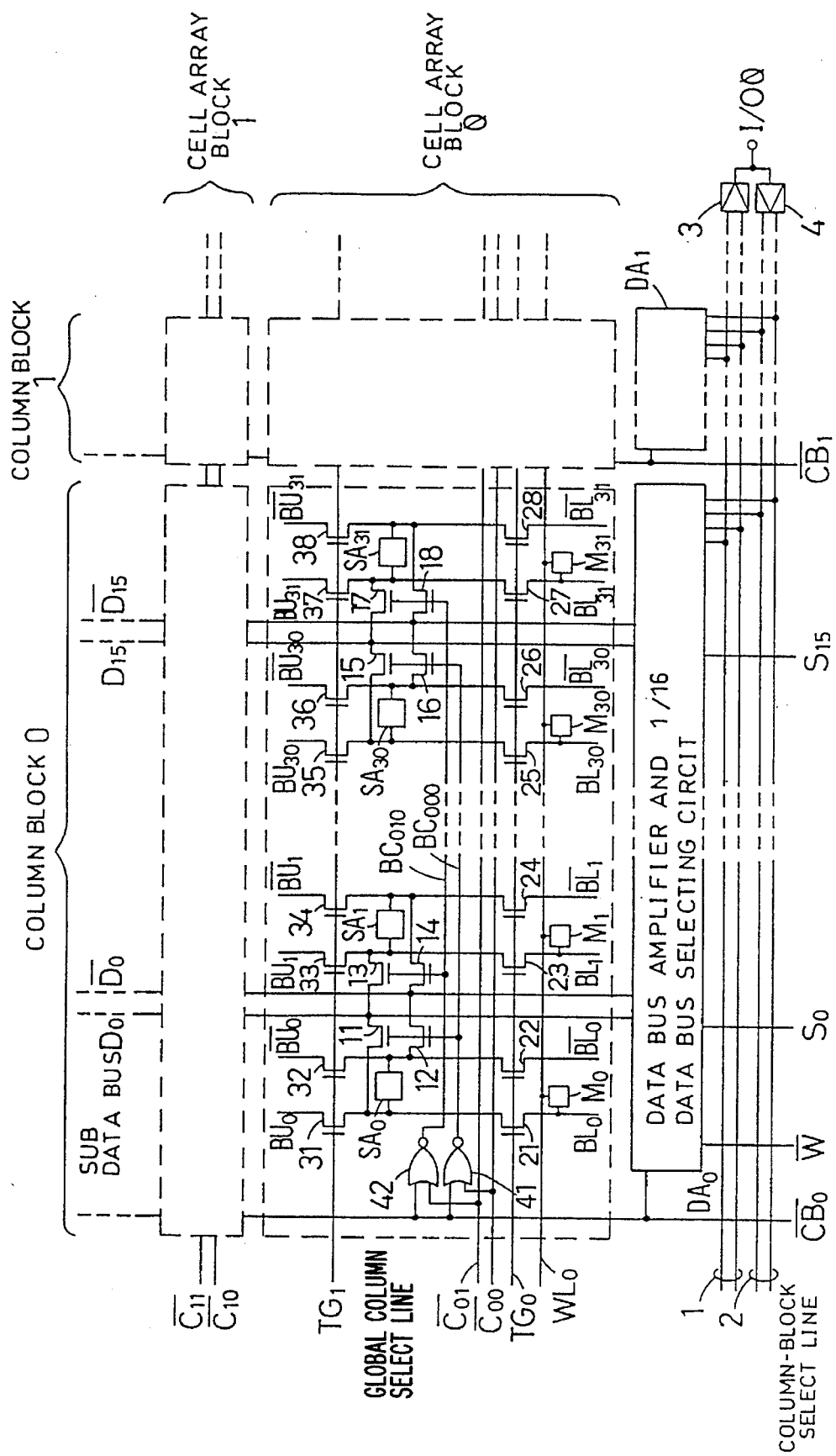
FIG. 1 is a circuit diagram showing the inside of a cell array block and the connection of cell array blocks to each other in a DRAM according to a first embodiment of the preset invention.
Figure 2:
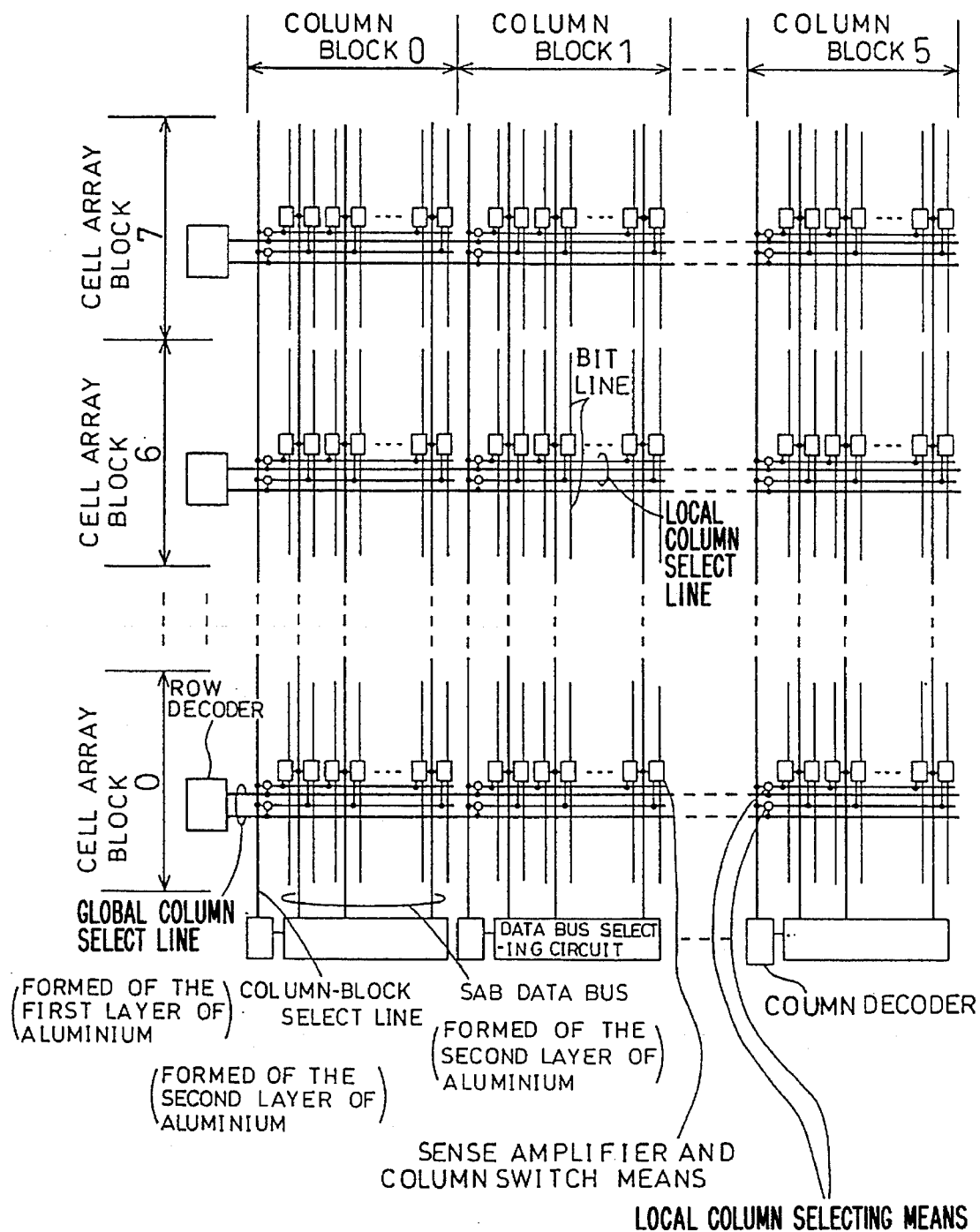
FIG. 2 is a schematic view showing, in a form nearer to thee actual layout than in FIG. 1, the inside of a cell array block and the connection of cell array blocks to each other in the DRAM according to the first embodiment of the present invention.

FIGS. 1 and 2 show in detail the inside of a cell array block and the connection of the cell array blocks to each other. For conveniences' sake, FIGS. 1 and 2 show only the left-side half portions corresponding to the I/O0. 512 Columns for one I/O are conceptually divided, in the bit-line direction, into 16 column blocks each having 32 columns, i.e., a column block 0, a column block 1 . . . a column block 15.

Figure 10:
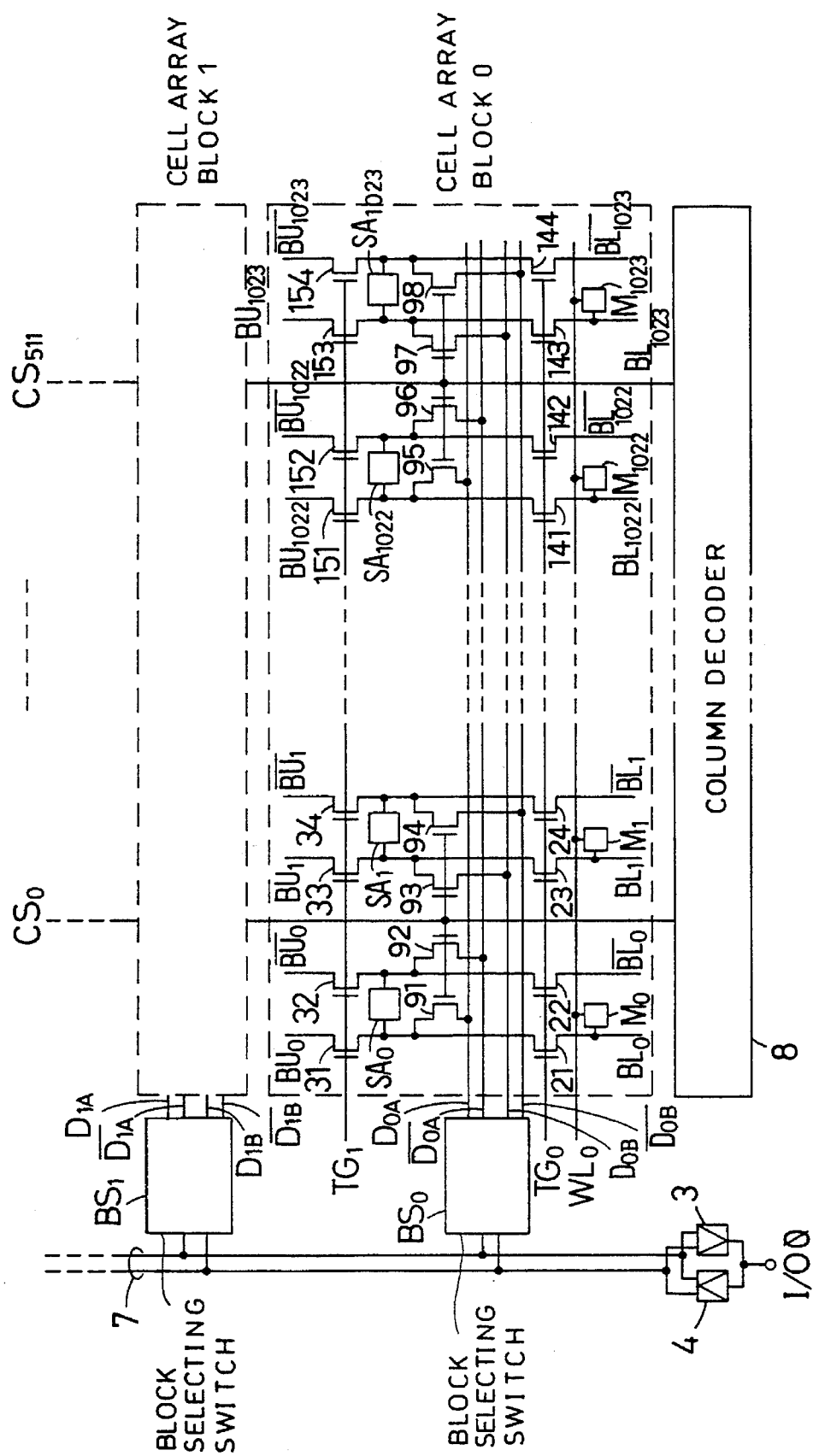
FIG. 10 is a circuit diagram showing the inside of a cell array block and the connection of cell array blocks to each other of a conventional semiconductor memory.

The following description will discuss the column block 0 in the cell array block 0 since the inside arrangements of all the cell array blocks are the same and the inside arrangements of all the column blocks in the cell array blocks are the same. A shared sense amplifier scheme is adopted, which is the same as the prior art of FIG. 10. More specifically, a bit-line connection selecting signal TG0 or TG1 causes sense amplifiers SA0, SA1 . . . SA30, SA31 to be connected, through switch transistors 21, 22, 23, 24 . . . 25, 26, 27, 28 or 31, 32, 33, 34 . . . 35, 36, 37, 38, to bit line pairs BL0, /BL0, BL1, /BL1 . . . BL30, BL30, BL31, /BL31 or BU0, /BU0, BU1, /BU1 . . . BU30, /BU30, BU31, /B31. A sense amplifying operation is to be carried out in each of the sense amplifiers SA0 . . . SA31. 128 Memory cells are connected to each of the bit line pairs, but only one memory cell for each lower bit line pair is shown in FIG. 1.

FIGS. 1 and 2 also show column-block select lines/CB0, /CB1 . . . /CB15 which are allocated to the column blocks 0 to 15, and which are wired in the direction in parallel with the bit lines such that the cell array blocks share each of the column-block select lines /CB0, /CB1 . . . /CB15.

Global select lines /C00, /C01, /C10, /C11 . . . are disposed, in parallel with word lines WL0 . . . , in the vicinity of the sense amplifiers in each cell array block (sense amplifiers SA0, SA1 . . . SA30, SA31 are specifically shown only for the cell array block 0). The inside-cell-array-block column select lines /C00, /C01, /C10, /C11 . . . are used for alternately selecting a half of the entire columns in each of the cell array blocks.

There are disposed pairs of sub data buses D0, /D0 . . . D15, /D15. More specifically, each pair of sub data buses is disposed for two columns, 16 pairs of sub data buses are disposed for each column block, and 256 pairs are disposed for one I/O. Likewise the column-block select lines /CB0, /CB1 . . . , the sub data buses D0, /D0 . . . D15, /D15 are disposed in parallel with bit lines BL0, /BL0 . . . such that the cell array blocks share these sub data buses. The column-block select lines /CB0, /CB1 . . . /CB15 and the sub data buses D0, /D0 . . . D15, /D15 are formed of the second layer of aluminium. Likewise the word lines WL0 . . . , the global column select lines /C00 . . . are formed of the first layer of aluminium.

In the column block 0 in the cell array block 0, there are disposed local inside-column-block column selecting means 41, 42, to the output terminals of which local column select lines BC000, BC010 are connected. One local column select line BC000 is connected to the gates of alternate column switch transistors (column switch means) 11, 12 . . . 15, 16, while the other local column select line BC010 is connected to the gates of the remaining alternate column switch transistors (column switch means) 13, 14 . . . 17, 18. These column switch transistors 11, 12 . . . 17, 18 are connected to corresponding alternate sense amplifiers SA0 . . . SA31 of which total number is equal to 16.

Data bus amplifier and 1/16 data bus selecting means DA0, DA1 . . . are connected to the sub data buses D0, /D0 . . . D15, /D15 and have a function of selecting the sub data bus of the column including the selected memory cell, out of the sub data buses D0, /D0 . . . . The inside arrangement of the data bus amplifier and 1/16 data bus selecting means DA0, DA1 . . . will be discussed later with reference to FIG. 3.

There are also disposed read main data buses 1, write main data buses 2, an output buffer 3, an input buffer 4 and a data input/output terminal I/O0.

The following description will discuss the operation of the DRAM having the arrangement shown in FIGS. 1 and 2.

After the sense amplifying operation starts, the column-block select line and the global column select line for a selected memory cell, become active. It is now supposed that the column-block select line /CB0 and the global column select line /C00 become active and are turned into a low level. The local column select line BC000 connected to the output terminal of the local column selecting means 41 comprising a NOR gate, is turned into a high level, causing the column switch transistors 11, 12 . . . 15, 16 to be electrically conducted. Alternate 16 sense amplifiers SA0 . . . SA30 are respectively connected to 16 pairs of sub data buses D0, /D0 . . . D15, /D15, one pair of sub data buses being disposed for two columns. The local column select line /C00 is shared by all the column blocks. However, the local column select lines for the cell array blocks and the column blocks, are made active according to the logical multiplication of the output of the global column select line /C00 and the output of each of the column-block select lines at right angles thereto. Accordingly, out of 256 pairs of sub data buses, only 16 pairs in one column block are connected to the sense amplifiers. The global column select lines /C00 . . . are disposed for the cell array blocks, but only the global column select line for the selected cell array block including the selected memory cell, becomes active. Only the sense amplifiers in the selected cell array block are connected to the sub data buses.

For example, it is now supposed that the memory cell M0 is selected. At the time of a read operation, only the data of the sub data buses D0, /D0 for the selected memory cell M0, out of the 16 pairs of sub data buses connected to the sense amplifiers, are selected and amplified by the data bus amplifier and 1/16 data bus selecting means DA0, and then supplied to the data input/output terminal I/O0 through the read main data buses 1 and the output buffer 3.

On the other hand, at the time of a write operation, data entered through the data input/output terminal I/O0 is transferred to the write main data buses 2 through the input buffer 4, then drives the sense amplifier SA0 through the sub data buses D0, /D0 selected by the data bus amplifier and 1/16 data bus selecting means DA0, and is written in the memory cell M0. In the first embodiment, in order to further increase the speed of the read operation, the main data buses are divided into reading buses and writing buses. However, it is apparent that I/O data buses, which are used in common for both read and write, can be utilized as the main data buses, without departing from the scope of the present invention.

Figure 3:
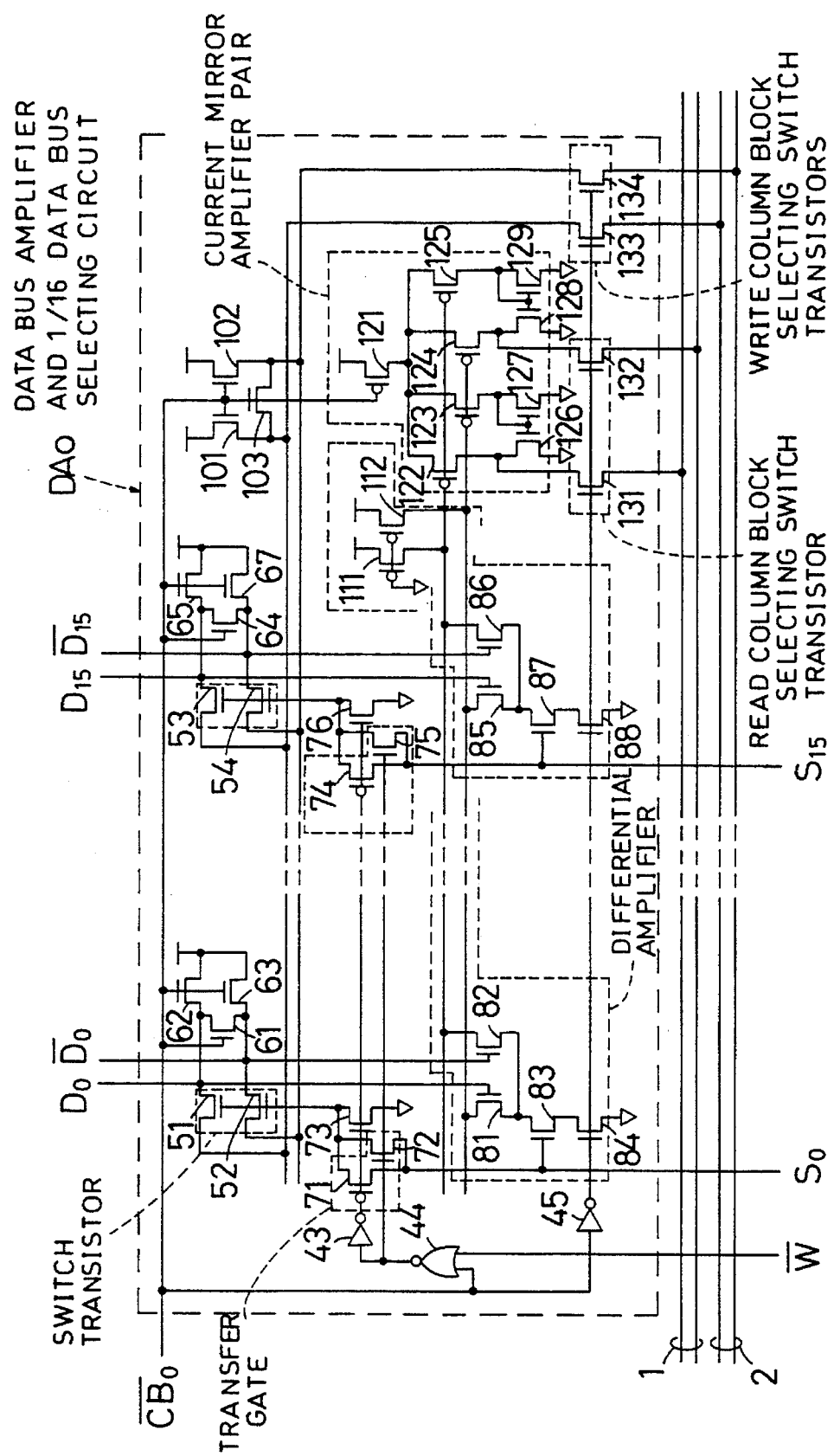
FIG. 3 is a circuit diagram showing the inside of a data bus amplifier and data bus selecting circuit of the DRAM in FIG. 1.

FIG. 3 shows in detail the inside arrangement of the data bus amplifier and 1/16 data bus selecting means DA0.

Shown in FIG. 3 are (i) 1/16 data bus selecting signals S0 . . . S15 for selecting one pair of sub data buses out of 16 pairs of sub data buses in the same column block and (ii) a write signal /W. There are also disposed a NOR gate 44, inverters 43, 45, switch transistors 51, 52 and 53, 54, voltage applying transistors 61, 67, transistors 71, 72 and 74, 75 for forming transfer gates, and transistors 73, 76. There are also disposed transistors 81~84 and 85~88 forming differential amplifiers together with two transistors 111, 112, voltage applying transistors 101~103, transistors 121~129 for forming pairs of current mirror amplifiers, read column block selecting switch transistors 131, 132, and write column block selecting switch transistors 133, 134.

The following description will discuss the operation of the data bus amplifier and 1/16 data bus selecting means DA0. When the memory cell M0 is selected, the 1/16 data bus selecting signal S0 is selected, and becomes active and is turned into a high level. Further, the column-block select line /CB0 in the selected column block becomes active and is turned into a low level. Accordingly, the output of the inverter 45 becomes a high level. This causes the series-connected transistors 83, 84 to be turned on. Then, at the time of a read operation, the data of the sub data buses D0, /D0 pass through the differential amplifiers formed by the transistors 81, 82, 83, 84, 111, 112, and are amplified by the current mirror amplifier pairs formed by the transistors 121, 122, 123, 124, 125, 126, 127, 128, 129. The data thus amplified pass through the read column block selecting switch transistors 131, 132 and drive the read main data buses 1 at a high speed. At this read operation, the write signal /W is in a high level and the transfer gate comprising the transistors 71, 72 is cut off. By the transistor 73, the gates of the switch transistors 51, 52 become a low level and are cut off, and the sub data buses are separated from the write main data buses 2.

At the time of a write operation, the write signal /W becomes active and is turned into a low level. Accordingly, the voltage of the 1/16 data bus selecting signal S0 is applied, through the transfer gate transistors 71, 72, to the gates of the switch transistors 51, 52, causing the same to be turned on. Further, when the column block is the selected one, the write column block selecting switch transistors 133, 134 are turned on. This causes the sub data buses D0, /D0 to be connected to the write main data buses 2. Accordingly, the data on the write main data buses 2 are transferred to the sub data buses D0, /D0.

In the foregoing, the description has been made of the operations relating to the data input/output terminal I/O0.

Operations relating to each of other data input/output terminals I/O1–I/O15 are similar to the operations above-mentioned. Thus, reading or writing is conducted simultaneously for the 16 bits.

Figure 11:
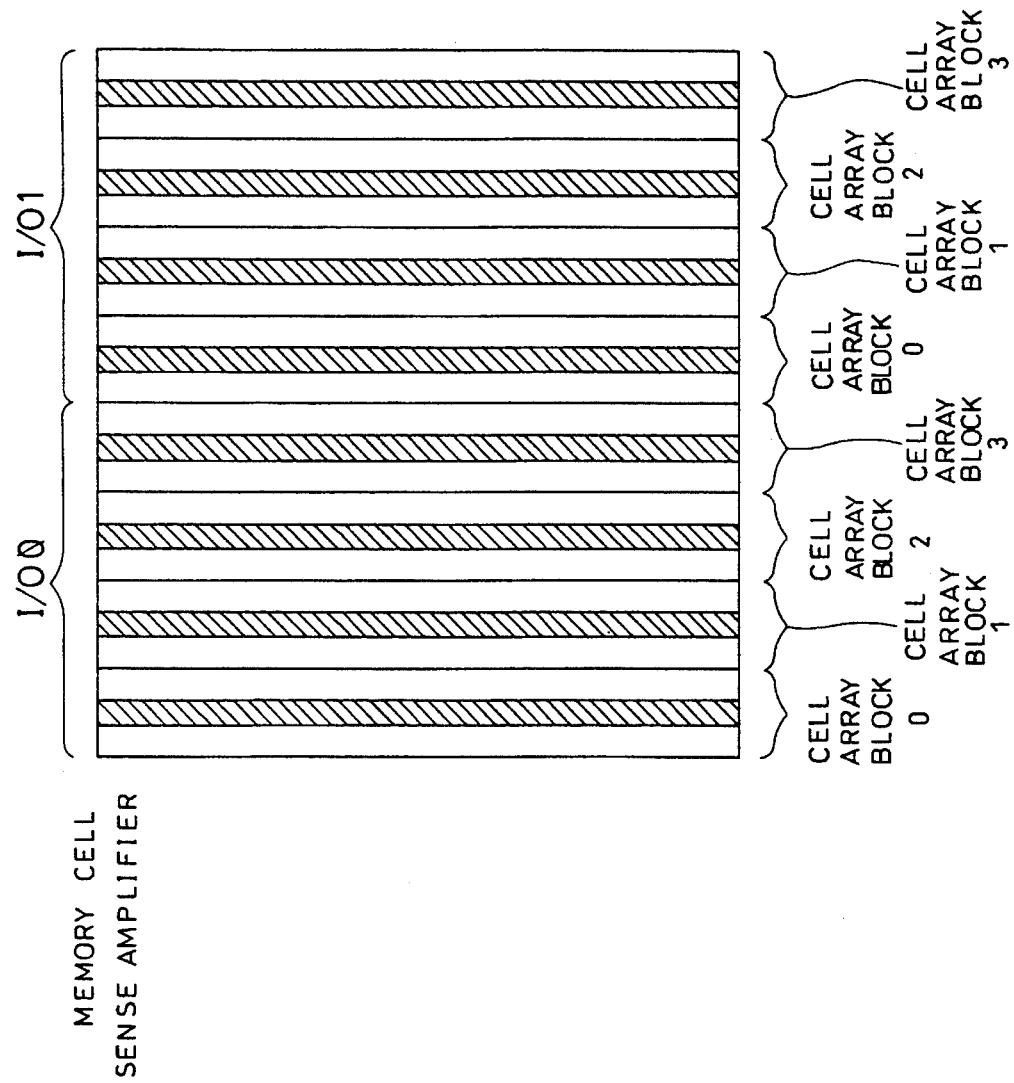
FIG. 11 shows a block diagram of cell arrays which are corresponding to ⅛ of the entire cell arrays of the conventional semiconductor memory.

In the case of a read operation, the sub data buses are required to be driven directly by the sense amplifiers. According to the first embodiment, however, the number of the column switch transistors connected to one sub data bus, is equal to 16 in which two transistors are prepared for each cell array block. Thus, as compared with the number 512 in the conventional example shown in FIGS. 10, 11, 12, this number 16 is considerably reduced, thereby to reduce the parasitic capacitance of the sub data buses. Due to restrictions in view of the layout, the drive capacity of the sense amplifiers cannot be increased so much. In this connection, the reduction of the sub data buses in parasitic capacitance serving as load capacity, is very effective in achieving a high-speed operation. In particular, the First embodiment adopts a shared sense amplifier scheme in which one sense amplifier (SA0) is shared by corresponding two bit line pairs (BL0, /BL0, BU0, /BU0). Therefore, the number of the column switch transistors connected to one sub data bus can be reduced by half as compared with a scheme in which no sense amplifier is shared.

According to the first embodiment, the global column select lines /C00, /C01 . . . select a half of the entire columns in one cell array block. However, provision may be made such that ¼, ⅛ or the like of the entire columns is selected, or that all the columns in one cell array block are selected at the same time. The number of the sub data bus pairs is equal to the number of columns simultaneously selected by each of the global column select lines /C00 . . . . Accordingly, when the number of columns to be simultaneously selected, is reduced, the number of the sub data bus pairs is reduced and the number of the column switch transistors connected to each sub data bus is increased, thereby to increase the parasitic capacitance. On the contrary, when the number of columns to be simultaneously selected, is increased, the number of the sub data bus pairs is increased and the number of the column switch transistors connected to each sub data bus is reduced, thereby to reduce the parasitic capacitance. However, if the number of the sub data bus pairs is increased so much, it is required to narrow the distance between adjacent lines. This makes the wiring difficult and increases the interwiring capacity to such an extent as not to be disregarded. Thus, the number of columns simultaneously selected by each of the global column select lines /C00 . . . can be determined with these factors collectively taken into consideration.

Provided that the number of columns simultaneously selected by each of the inside-cell-array-block column select lines /C00 . . . is constant, as the number of columns simultaneously selected by each of the column-block select lines /CB0 . . . , i.e., the number of columns in one column block, is increased, the number of sub data buses connected to the sense amplifiers is increased, thereby to increase the power consumption. As the number of columns in one column block is decreased, the number of sub data buses connected to the sense amplifiers is decreased, thereby to lower the power consumption. However, if the number of columns in one column block is reduced excessively, the number of the column-block select lines /CB0 . . . is increased. This not only causes trouble as to the wiring space, but also increases the number of the local column selecting means 41, 42. This also presents a problem in view of layout space. According to the first embodiment, the number of the columns present in one column block is set to 32. Such a number presents no problem because the column-block select lines /CB0 . . . and the local column selecting means 41 . . . can be disposed with the use of spaces or the like formed at portions at which the polysilicon word lines come in contact with aluminum shunt. Further, the number of the sub data bus pairs simultaneously connected to the sense amplifier is as small as 16. As far as the number of the sub data bus pairs is in such a range, the power consumption required for driving the sub data bus pairs causes no trouble.

(Second Embodiment)

Figure 6:
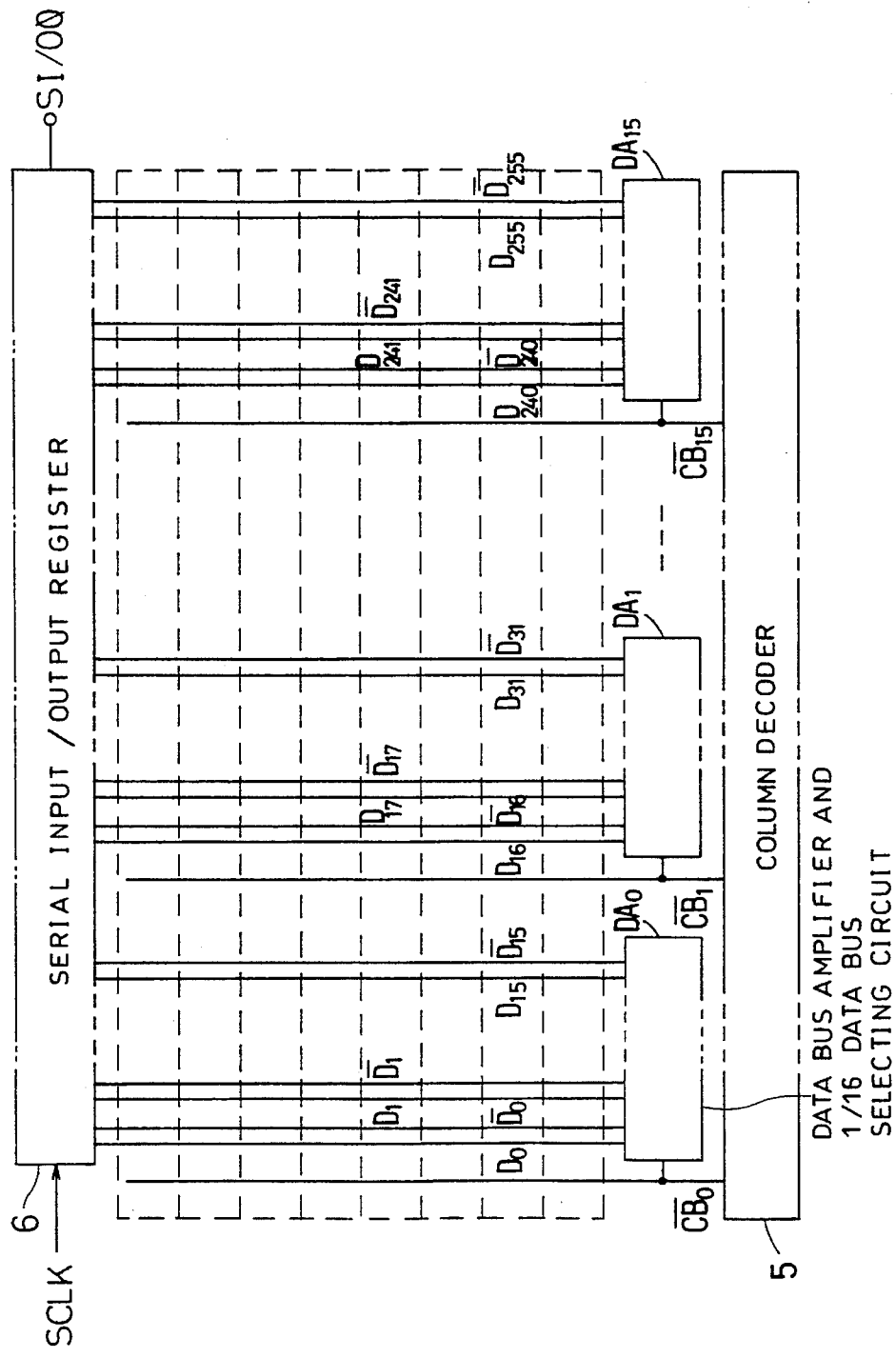
FIG. 6 is a block diagram of a DRAM according to a second embodiment of the present invention in which input/output registers are added.

FIG. 6 shows a second embodiment in which serial input/output registers are added to the DRAM according to the first embodiment of the present invention. In FIG. 6, a 256-bit register is used as each serial input/output register 6 such that one bit of the serial input/output register 6 is connected to each pair of sub data buses (D0, /D0), (D1, /D1) . . . .

When transferring data from memory cells to a serial input/output register 6, all column-block select lines /CB0, /CB1 . . . /CB15 are made active after the sense amplifying operation starts. Accordingly, 256-bit data which has been selected, out of 512-bit data corresponding to the I/O0 on a selected word line, by one line selected from global column select lines /C00 . . . , is transferred to 256 pairs of sub data buses D0, /D0, D1, /D1 . . . D255, /D255. By latching the data into the 256-bit serial input/output register 6 connected to one ends of the sub data buses, the transferring operation is completed. The data latched in the serial input/output register 6 is output from the serial input/output terminal SI/O0 synchronized with the serial clock input SCLK.

On the contrary, when transferring data from a serial input/output register 6 to memory cells, all the column-block select lines /CB0, /CB1 . . . /CB15 are made active before a sense amplifying operation starts. The amplifying operation starts at the point where 256 pairs of sub data buses, selected by a global column select line, are driven to such an extent that the data read from memory cells to the 256 bit line pairs selected by the global column select line is overwritten by data from the serial input/output register and the voltage differences between the bit line pairs become the same level as those which were originally created by reading the memory cell data. Accordingly, the data of the serial input/output register 6 is written in 256 memory cells selected, out of 512 memory cells corresponding to the I/O0 on the selected word line, by the global column select line, and the remaining 256 memory cells are refreshed. The data of the serial input/output register 6, which can be transferred to the memory cells as described above, is serially input from the serial input/output terminal SI/O0 synchronized with the serial clock input SCLK.

In the foregoing, there have been discussed, by way of example, the operations relating to the memory cells and the serial input/output register 6 corresponding to the data input/output terminal I/O0. However, serial input/output registers are also disposed for memory cells corresponding to other data input/output terminals. Thus, data transfer is conducted simultaneously for 16 bits between memory cells and the serial input/output registers, and serial output/input operations are conducted simultaneously for 16 bits.

Thus, according to the second embodiment, data transfer between memory cells in the cell array blocks and the serial input/output registers 6 disposed outside of the cell array blocks, can be conducted through the sub data buses D0, /D0 . . . . Therefore, it is not required to newly dispose lines for data transfer, but the serial input/output registers 6 can be shared by the cell array blocks. Thus, there can be provided an inexpensive DRAM having a serial input/output function without the chip area or the number of wiring layers increased.

(Third Embodiment)

Figure 7:
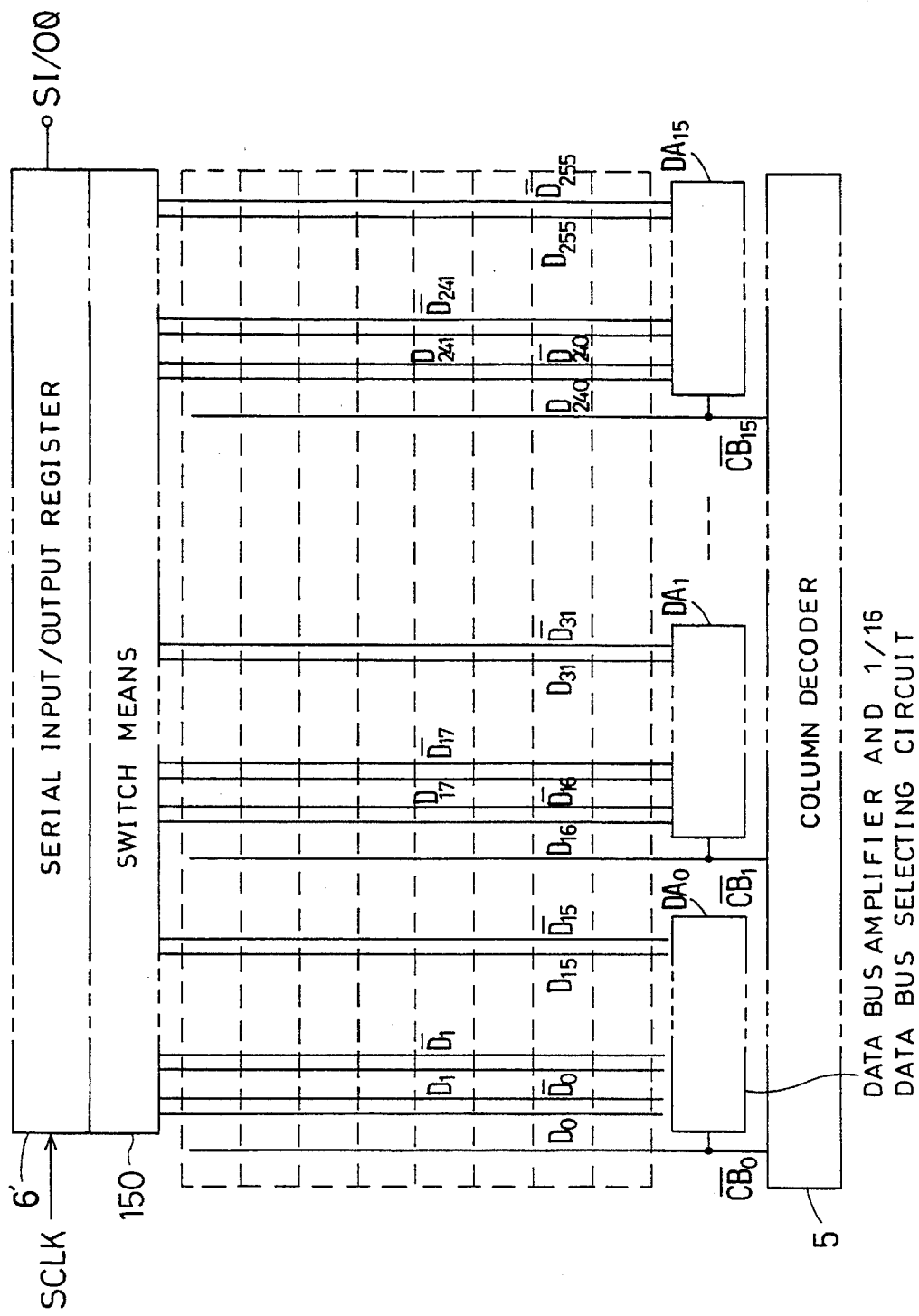
FIG. 7 is a block diagram of a DRAM according to a third embodiment of the present invention in which there are added serial input/output registers and switch means.

FIG. 7 shows a third embodiment in which the serial input/output registers 6 in the DRAM having a serial input/output function according to the second embodiment in FIG. 6, are changed in bit number, and in which a plurality of switch means are further disposed. More specifically, the bit number of each of the serial input/output registers 6 in FIG. 6 is equal to the number of the sub data bus pairs which is 256. However, the bit number of each serial input/output register 6' in FIG. 7 is doubled and equal to 512. With the use of switch means 150 in FIG. 7, data transfer can be conducted by continuously using twice the sub data buses D0, /D0 . . . in a single memory cycle.

Each switch means 150 is disposed such that each two bits of each serial input/output register 6' correspond to each one pair of sub data buses, and that this one pair of sub data buses is selectively connected to one of the corresponding two bits.

More specifically, when transferring data from memory cells to a serial input/output register 6', the first 256 bits are transferred to alternate 256 bits of the serial input/output register 6' after a sense amplifying operation has started, likewise in the second embodiment. When with the word lines and the sense amplifiers remaining unchanged, only the line selected from global column select lines /C00, /C01 . . ., is changed to another line, data on the sub data buses are changed. Thereafter, when the switch means 150 is switched to change, to the other bit, the bit of the serial input/output register 6' to be connected to the sub data buses, the next 256 bits can be continuously transferred to the other alternate 256 bits of the serial input/output register 6'.

When transferring data from a serial input/output register 6' to memory cells, a potential difference may be provided between the bit lines of pairs according to the first alternate 256 bits of the serial input/output register 6' before a sense amplifying operation starts, likewise in the second embodiment. Then, the global column select line /C00, /C01 . . . and the switch means 150 may be switched and a potential difference may be provided between the bit lines of the remaining pairs according to the remaining alternate 256 bits of the serial input/output register 6', after which a sense amplifying operation may be conducted. In such a case, the data of the serial input/output register 6' is written in all the memory cells on one word line.

In the DRAM in FIG. 1, the address space is equal to 1024 rows×1024 columns, and there are 512-bit data for one I/O on one word line. Accordingly, 1024-bit data for one line are present as divided into portions on two word lines respectively belonging to different cell array blocks. With this fact utilized, it is possible to quadruple the bit number of each serial input/output register 6' to 1024, thus enabling data on the same row address in different cell array blocks to be continuously transferred. In this case, too, the global column select line /C00, /C01 . . . and the switch means 150 may be switched in the same memory cycle. However, it is required that those portions of each serial input/output register 6' corresponding to four bits are connected to a pair of sub data buses through the switch means 150 and that two global column select lines from each of two different cell array blocks are selected.

(Fourth and Fifth Embodiments)

Figure 8:
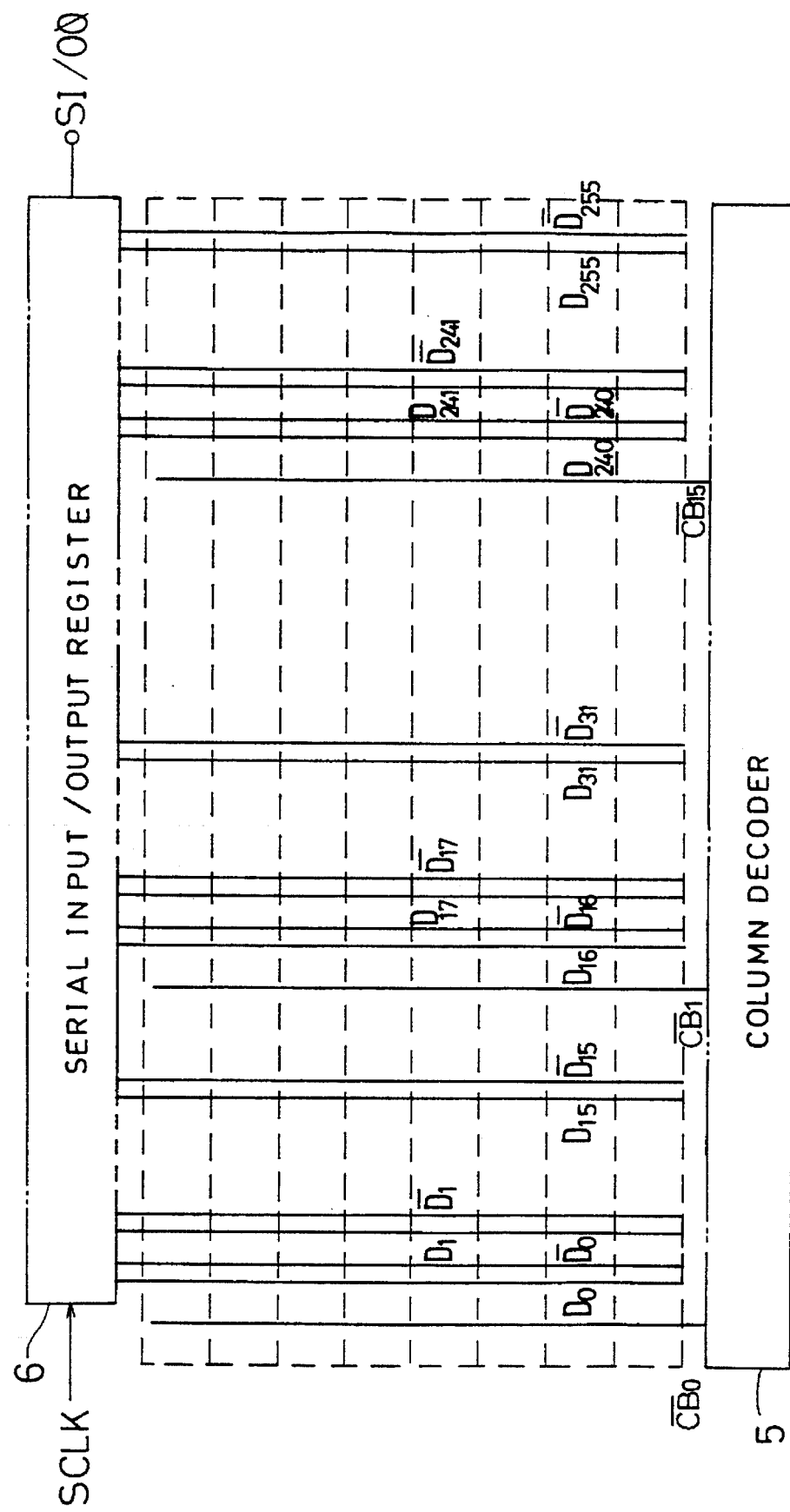
FIG. 8 is a block diagram of a semiconductor serial input/output memory according to a fourth embodiment of the present invention.
Figure 9:
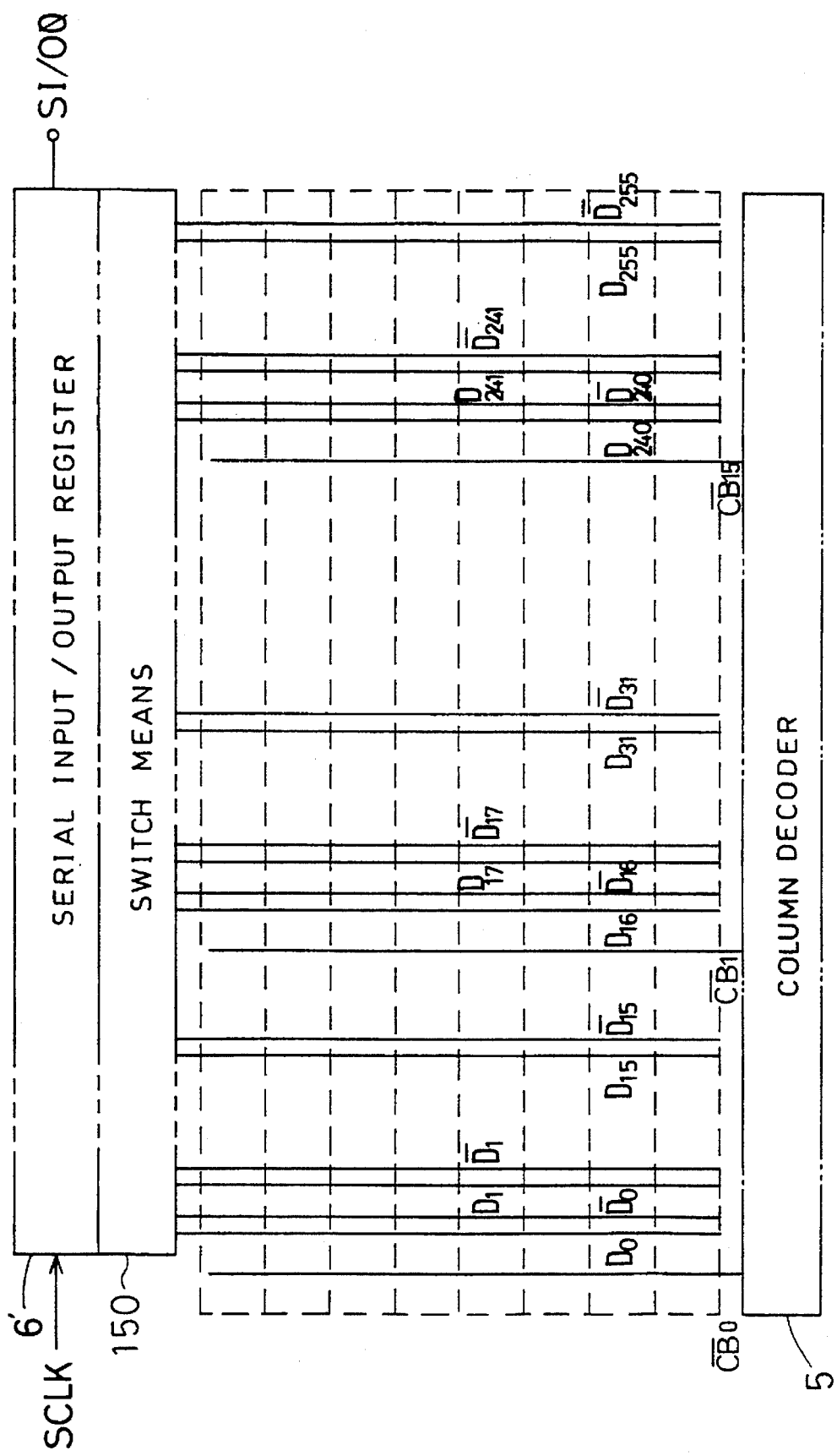
FIG. 9 is a block diagram of a DRAM according to a fifth embodiment of the present invention in which switch means is added to a semiconductor serial input/output memory.

FIGS. 8 and 9 show semiconductor serial input/output memories in each of which there are taken away, from the DRAM having a serial input/output function in FIG. 6, random input/output means, i.e,, the data input/output terminals I/O0–15 the input buffer 4, the output buffer 3, the read main data buses 1, the write main data buses 2, and the data bus amplifier and data bus selecting circuits DA0 . . . . Read and write operations in these semiconductor serial input/output memories, are similar to those in each of the second and third embodiments. Therefore, the description thereof is here omitted.

In the second and third embodiments, there are used, as the registers, serial input/output registers 6, 6', but there may also be used registers having only a serial input function, registers having only a serial output function, or registers having no serial input/output function. Further, both serial input registers and serial output registers may be used, and data transfer may be conducted between these registers and memory cells through sub data buses.

In the second and third embodiments, all the column-block select lines /CB0 . . . are made active when transferring data between the serial input/output registers and memory cells. However, column-block select lines may be selectively made active such that data transfer to portions of the registers, i.e., split transfer, is conducted. It is a matter of course that these arrangements are also included in the scope of the present invention.

What is claimed is:

1. A semiconductor memory having a plurality of cell array blocks which have dynamic memory cells arranged in rows and columns and sense amplifiers for amplifying read signals from the dynamic memory cells, said semiconductor memory comprising:

a plurality of column-block select lines each shared by said plurality of cell array blocks and extending substantially in parallel with bit lines, a selected column-block select line being adapted to select a predetermined column block out of a plurality of column blocks in said plurality of cell array blocks;

a plurality of global column select lines each disposed for a cell array block and extending in the direction which intersects said column-block select lines, a selected global column select line being adapted to simultaneously select a plurality of predetermined columns out of each of said plurality of column blocks;

a plurality of sub data buses each shared by said plurality of cell array blocks, said sub data buses being substantially in parallel with said column-block select lines, where the number of sub data buses disposed in each column block corresponds to the number of data bits carried by the columns, in each column block, simultaneously selected by a global column select line;

a plurality of local column selecting means respectively disposed corresponding to the positions where said plurality of column-block select lines cross said plurality of global column select lines, said plurality of local column selecting means being adapted such that the output of the local column selecting means corresponding to the position where an activated column-block select line crosses an activated global column select line, is made active; and a plurality of local column select lines connected to the output terminals of said local column selecting means, each local column select line being connected to the input terminals of column switch transistors which connect sense amplifiers, of columns selected by an associated global column select line, in a cell array block comprising the associated global column select line, and in a column block selected by an associated column-block select line, to sub data buses in the selected column-block.

2. A semiconductor memory according to claim 1, further comprising data bus selecting means for selecting, out of the plurality of sub data buses, the sub data buses relating to the column including a selected memory cell, and for connecting said selected sub data buses to main data buses such that said semiconductor memory serves as a semiconductor dynamic random access memory.

3. A semiconductor memory according to any of claims 1 and 2, wherein the sense amplifiers are shared-type sense amplifiers to each of which any pair of a plurality of pairs of bit lines is selectively connected.

4. A semiconductor memory according to any of claims 1 to 3, wherein each local column selecting means is formed by a NOR gate.

5. A semiconductor memory according to any of claims 1 to 4, wherein the main data buses comprise read main data buses and write main data buses.

6. A semiconductor memory according to any of claims 2 to 5, wherein the data bus selecting means is provided to selectively couple the sub data buses to the main data buses through differential amplifiers at the time of a read operation.

7. A semiconductor memory according to any of claims 1 to 6, wherein the plurality of column-block select lines and the plurality of sub data buses are formed of the same wiring layer.

8. A semiconductor memory according to any of claims 1 to 7, further comprising at least one register to which the plurality of sub data buses are coupled, whereby data transfer is conducted, through corresponding sub data buses, between said register and the whole or a portion of a plurality of memory cells on a selected word line.

9. A semiconductor memory according to any of claims 1 to 7, further comprising at least one register connected to the plurality of sub data buses through switch means for exchanging the connection relationships between the bits of said register and said sub data buses, whereby by switching an global column select line and said switching means in the course of one memory cycle, data on said sub data buses are also switched such that data transfer is conducted between said register and the whole or a portion of a plurality of memory cells on a selected word line through a plurality of interventions of said sub data buses in one memory cycle.

10. A semiconductor memory according to any of claims 8 and 9, wherein the register has a serial input function, a serial output function or a serial input/output function, such that said semiconductor memory serves as a semiconductor dynamic random access memory having a serial input function, a serial output function or a serial input/output function.

11. A semiconductor memory according to any of claims 8 and 9, wherein the register has a serial input function, a serial output function or a serial input/output function, such that said semiconductor memory serves as a semiconductor serial input/output memory.

* * * * *

UNITED STATES PATENT AND TRADEMARK OFFICE
CERTIFICATE OF CORRECTION

PATENT NO. : 5,499,215
DATED : March 12, 1996
INVENTOR(S) : Hatta

It is certified that error appears in the above-identified patent and that said Letters Patent is hereby corrected as shown below:

On the cover page:

In the Abstract, line 8, change "all" to --an--.

In the Specification:

Column 4, line 29, change "inside-column-local" to --local--.

Column 5, line 34, change "preset" to --present--; and
line 36, change "thee" to --the--.

Column 7, line 15, change "local inside-column-block" to --local--; and
line 51, change "local" to --global--.

Signed and Sealed this

Ninth Day of May, 2000

Attest:

Q. TODD DICKINSON

*Attesting Officer*     *Director of Patents and Trademarks*